US006931721B2

(12) United States Patent
Huang

(10) Patent No.: US 6,931,721 B2
(45) Date of Patent: Aug. 23, 2005

(54) METHOD FOR IMPROVING EMC OF KEYBOARD SOFT BOARD

(75) Inventor: Bright Huang, Taipei (TW)

(73) Assignee: Silitek Corporation, Taipei (TW)

( * ) Notice: Subject to any disclaimer, the term of this patent is extended or adjusted under 35 U.S.C. 154(b) by 0 days.

(21) Appl. No.: 10/231,109

(22) Filed: Aug. 30, 2002

(65) Prior Publication Data

US 2003/0200652 A1 Oct. 30, 2003

(30) Foreign Application Priority Data

Apr. 30, 2002 (TW) ....................................... 91108933 A

(51) Int. Cl.[7] .................................................. H05K 3/30

(52) U.S. Cl. ............................ 29/832; 29/825; 29/842; 29/846

(58) Field of Search .......................... 29/825, 832, 874, 29/876, 884, 842, 840, 846, 592.1

(56) References Cited

FOREIGN PATENT DOCUMENTS

EP 0778683 A2 * 6/1997

* cited by examiner

*Primary Examiner*—Carl J. Arbes

(74) *Attorney, Agent, or Firm*—Birch, Stewart, Kolasch & Birch, LLP

(57) ABSTRACT

A method for improving the EMI compatibility of the keyboard soft board is disclosed. A low-pass filter is installed on the scan lines of the keyboard soft board to remove high-frequency noise signals produced by the soft board circuit, achieving the EMC requirement. The low-pass filter is formed between the input terminal of the scan line and the touch pad. An inductance is selectively installed and between the touch pads. A capacitance is formed between the touch pad of the scan line and a ground network. The method of forming the capacitance is to form ground pads on the ground network corresponding the scan line touch pads. The method of forming the inductance may be achieved through a reversed U-shaped inductor.

14 Claims, 4 Drawing Sheets

METHOD FOR IMPROVING EMC OF KEYBOARD SOFT BOARD

BACKGROUND OF THE INVENTION

1. Field of Invention

The invention relates to a method for improving EMC (Electromagnetic Compatibility) and, in particular, to a method for improving the EMC on keyboard soft boards.

2. Related Art

Current electronic devices often need to be able to generate high-frequency signals due to the high-speed and digital requirements. The production of such high-frequency signals may cause EM (Electromagnetic) radiation due to the antenna effect from its circuit. In other words, the high-frequency circuits often become antenna themselves. Therefore, the designer has to take into account these effects, making sure that no high-frequency signals are radiated out to result in undesired EMI (Electromagnetic Interference) inside the electronic device. The requirement of EMC (Electromagnetic Compatibility) is thus demanded.

This kind of EMC requirement also applies to keyboard products. To satisfy the EMC requirement, normal keyboards have to be able to remove noise signals from its circuit. A common method is to provide EM protection, such as a metal shielding or grounding the system. However, installing a metal shielding makes the keyboard heavier and is thus inconvenient in use. Grounding the system imposes extra design costs on the keyboard. Consequently, a simple and cheap method developed to improve the EMC in the keyboard circuits is desired.

SUMMARY OF THE INVENTION

In view of the foregoing problems, the invention provides a method for improving the EMC on keyboard soft boards. According to the method, the EMC is already taken into account in the layout design of the keyboard soft board, without either increasing the cost or affecting existing functions.

To achieve to above-mentioned objective, the disclosed method provides a low-pass filter, such as the π filter, for each scan line during the circuit layout of the keyboard soft board. The π filter of each scan line is comprised of more than one inductor connected in series and more than one capacitor connected in parallel. The inductor may be disposed between the touch pads of each scan line or between the touch pad and the input terminal of the scan line. The capacitor can be disposed between the touch pad of the scan line and a ground network of the keyboard soft board.

Each capacitor can be selectively connected to a touch pad of the ground network. It is preferably to form a ground pad at each ground point. Each inductor can be placed in a reversed U shape, with preferably an interval of about 0.3 mm. The position of each inductor is preferably connected between the input terminal of the scan line and the first touch pad.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
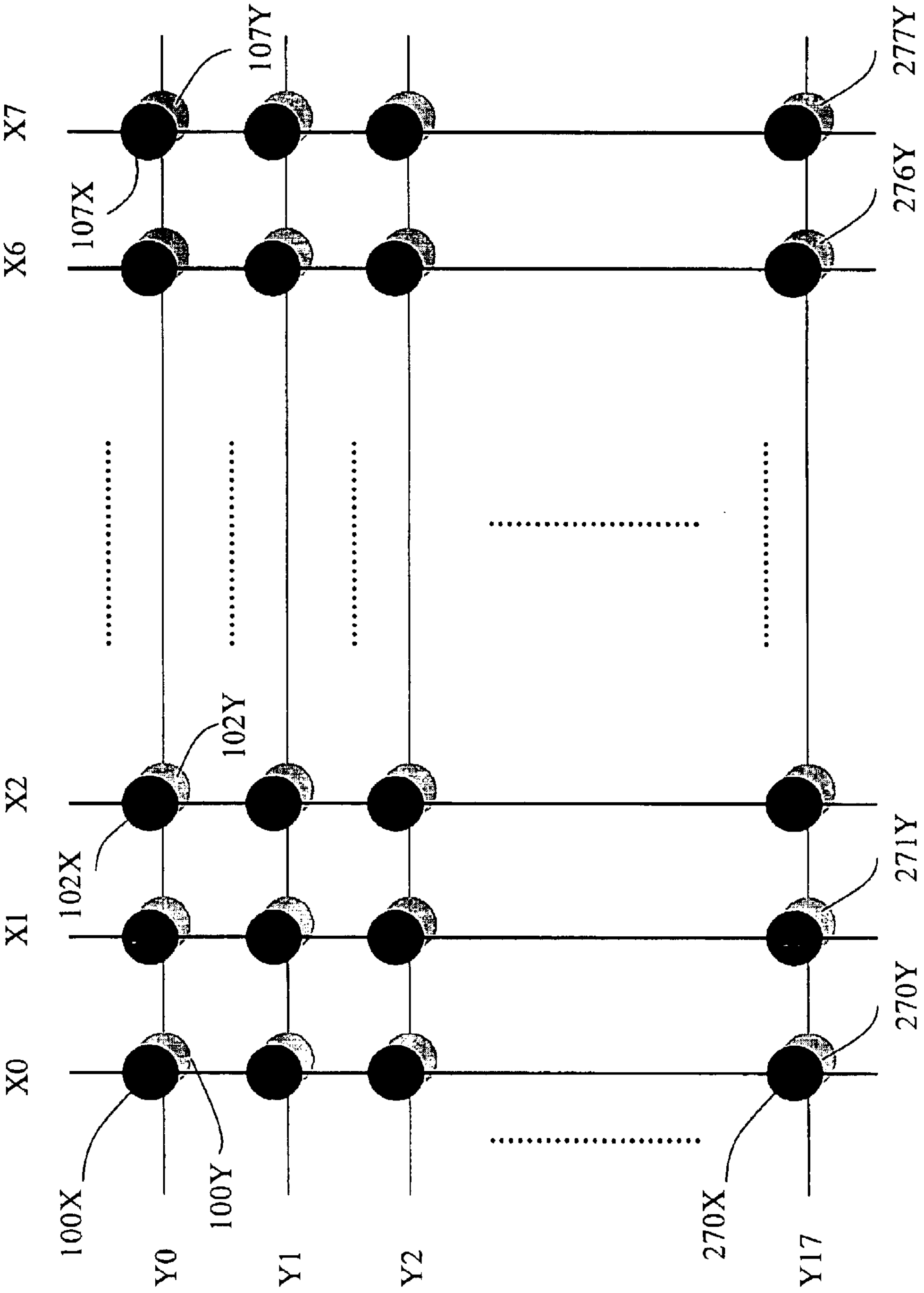
FIG. 1 (PRIOR ART)
FIG. 1 is a schematic view of the soft board structure in the prior art.

First, please refer to FIG. 1. In the drawing, the structure of a conventional keyboard soft board is shown to have three layers: the first layer being a return line layer, the second layer being an insulation layer (not shown), and the third layer being a scan line and a ground network on its back. The return line is the line layer labeled by X. FIG. 1 presents an example of 8 return lines, X0, X1 . . . X7, and 18 scan lines, Y0, Y1 . . . Y17. Each return line corresponds to a touch pad on the scan line layer, forming a conductive part. For example, the touch pad 100X corresponds to the touch pad 100Y, the touch pad 102X corresponds to the touch pad 102Y, the touch pad 107X corresponds to the touch pad 107Y, and so on.

Therefore, when the user presses some key on the keyboard, the touch pad on the return line layer gets into contact with the touch pad on the scan line layer. The keyboard thus sends out the signal representing this key.

Figure 2:
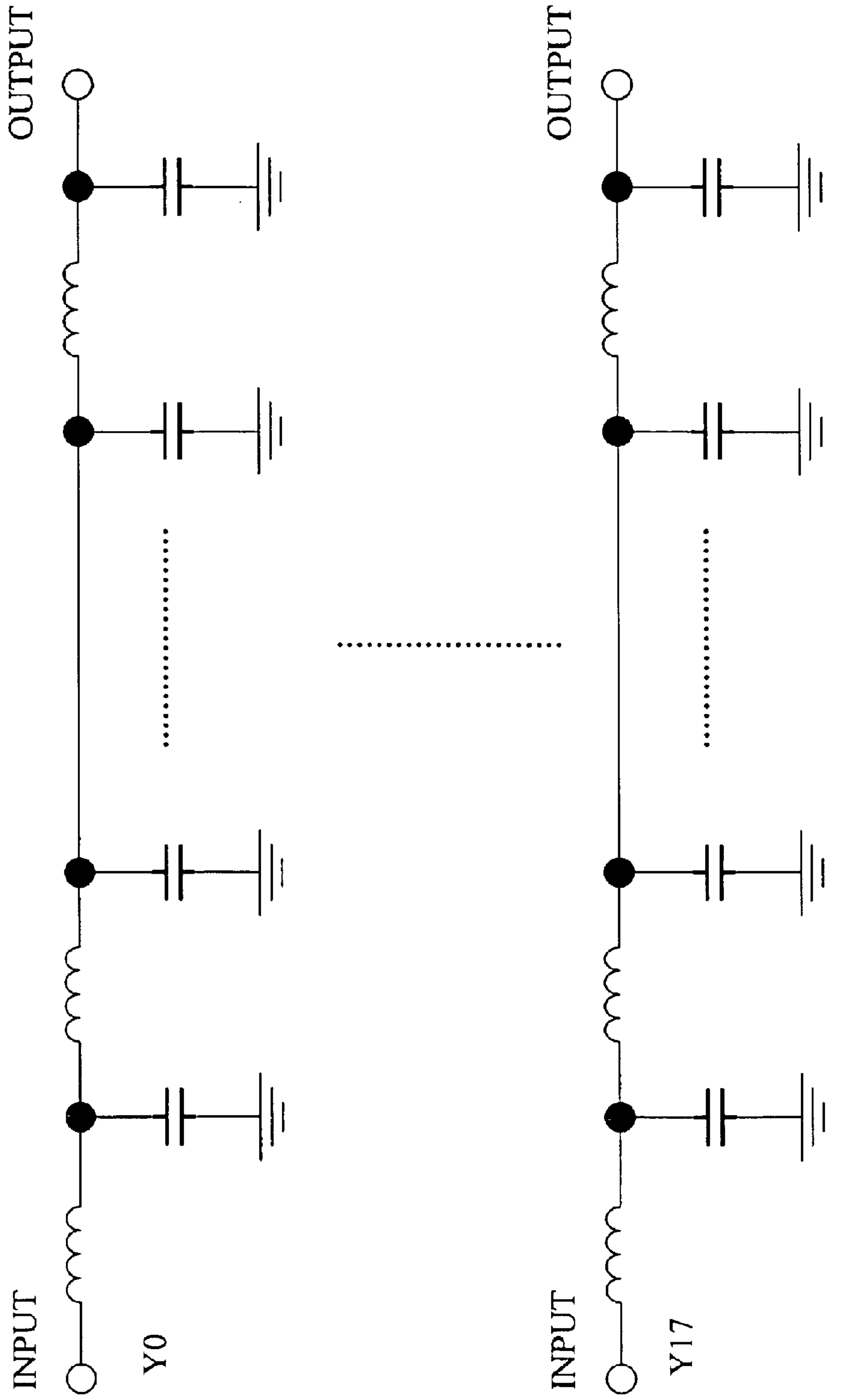
FIG. 2 is a schematic view of the disclosed installed with π filters.

To avoid the generation of EMI signals, the invention utilizes a π filter circuit structure on the soft board to remove possible noise EM signals. The antenna effect can thus be prevented in the soft board circuit to improve the EMC. In other words, a low-pass filter, such as a π filter, is designed in the layout of the soft board. The position of the π filter is preferably installed at the scan lines Y0~Y17, as shown in FIG. 2. Since the scan lines send out 25 kHz scan signals (the exact value depending upon the keyboard type) from the keyboard IC. These signal are used to extract the input information clock of the keyboard, converting them into input signals. Thus, it is a possible place to generate noise signals.

The purpose to install the low-pass filters is to remove the high-frequency noise signals generated by the circuit, but not the signals produced by the circuit, e.g. the scan frequency signals. The frequency response H(w) of the filter is a controllable value. Therefore, it could be taken into account during the circuit design. In the following paragraphs, we will use two embodiments to explain the feasibility of the invention.

Figure 3:
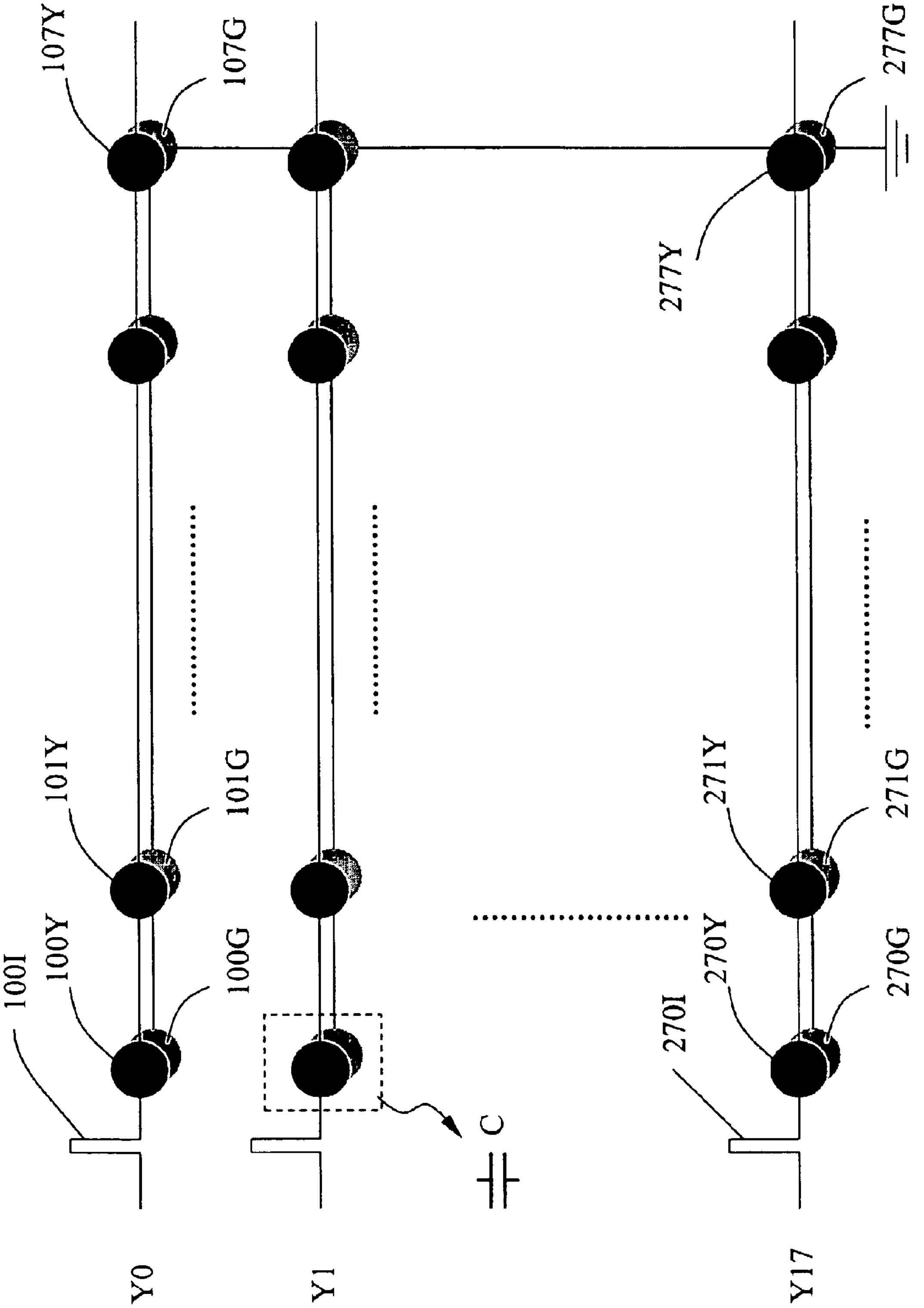
FIG. 3 is a first embodiment of the disclosed installed with π filters.

With reference to FIG. 3, a first embodiment of the invention, a reversed U-shaped inductor is provided on the scan circuit, e.g. the reversed U-shaped inductors 100I and 270I. A capacitor is connected between each touch pad on the scan line and the ground line. A ground pad is formed at a position on the ground network corresponding to the touch pad of each scan line. As shown in FIG. 3, each of the ground pads 100G, 101G, 107G, 270G, 271G, and 277G is a capacitor. In this method, each scan line constitutes a π filter and has the function of a low-pass filter.

In practice, the position of the reversed U-shaped inductor is preferably at the input terminal of the scan line, e.g. the reversed U-shaped inductors 100I and 270I in FIG. 3. The interval between the reversed U-shaped inductors is preferably 0.3 mm or so. The longer the upward extension length is, the better it is. The actual length id determined by the space on the soft board. The size of the capacitors is determined by the diameter (3~4 mm) of the touch pad and ground pad. The bigger the number of capacitors is, the better the filtering effect is and so is the capacitance value. Specifically, C=ϵA/d; that is, the capacitance of each capacitor is proportional to the pad area A but inversely proportional to the distance d between the touch pad and the ground pad. Since the distance d between touch pad and the ground network is fairly small (about 0.01 mm), the capacitance thus formed is pretty large, enhancing the filtering effect. Most conveniently, these inductors and capacitors can be directly manufactured at the same time the soft board circuit is formed.

Figure 4:
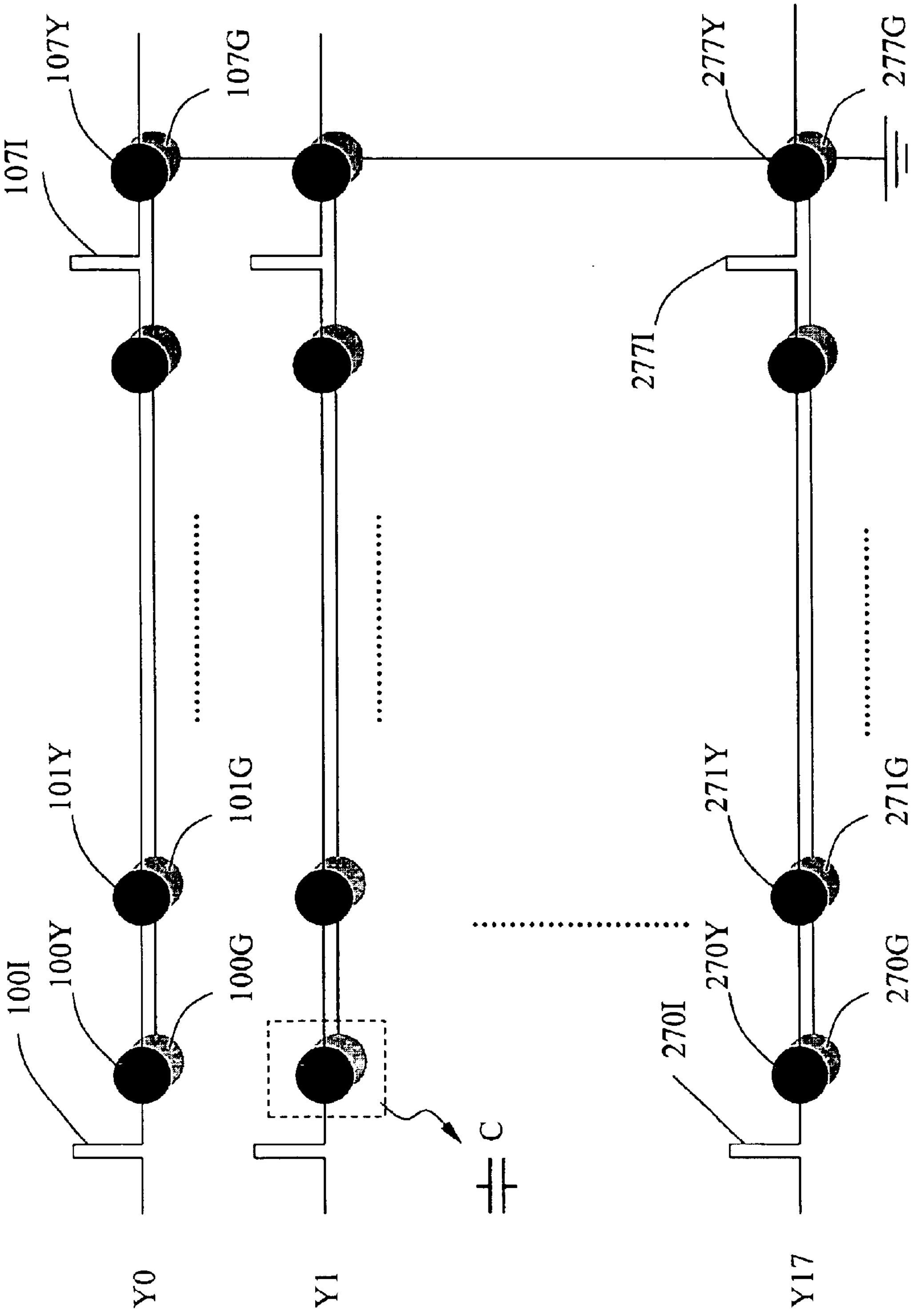
FIG. 4 is a second embodiment of the disclosed installed with π filters.

Please refer to FIG. 4 for a second embodiment of the invention with a π filter. In this embodiment, reversed U-shaped inductors 107I, 277I are provided at the end of the scan line. That is, they are installed at the last return line X7, in front of the touch pads 107Y~277Y of the scan lines. Such a configuration also satisfies the requirement of the invention.

In fact, as long as the inductors and capacitors are provided at appropriate positions, the desired low-pass filters can be formed. Therefore, the positions of the inductors and capacitors can be anywhere in any fashion. The shape of the inductors is not limited to the above-mentioned reversed U shape, either. In other words, as long as the EMC requirement is met, the low-pass filters can be installed at any positions in the keyboard circuit and implemented according to the disclosed method.

Please refer to Attachments 1 and 2, which compare the EMI effects before and after using the disclosed π filters on the keyboard soft board. Before the disclosed keyboard soft board is used, there are seven places producing noises exceeding the standard 6 dB. After the disclosed circuit is used, there is left with only one place. From this example, one sees that the invention can effectively control the output of over 6 dB noise signals.

In addition, using the disclosed keyboard soft board can improve the EMC with a simple design so that the costs and existing functions are unchanged.

What is claimed is:

1. A keyboard with improving EMC, comprising from top to bottom direction:

a return line layer with a plurality of touch pads;

an insulation layer;

a scan line layer with a plurality of touch pads on a front face thereof;

at least one ground pad on a read face of the scan line layer and opposite to one of the touch pads of the scan line layer; and A return line layer of U-shape formed on the front face of the scan line layer and connected with one of the touch pads of the scan line layer;

wherein the ground pad forms a capacitor with corresponding touch pad of the scan line layer and the return line layer forms an inductor providing a filter circuit with the capacitor.

2. The keyboard with improving EMC as in claim 1, wherein the diameters of the touch pad and the ground pad are preferably between 3 mm and 4 mm.

3. The keyboard with improving EMC as in claim 1, wherein the return line layer is of reverse U shape.

4. The keyboard with improving EMC as in claim 3, wherein the interval between the reversed U-shaped inductors is preferably about 0.3 mm.

5. The keyboard with improving EMC as in claim 1, wherein the elongate-shaped trace is formed at an input end of the scan line layer.

6. A method for improving EMC (Electromagnetic Compatibility) of a keyboard soft board, which comprises the steps of providing a return line layer with a plurality of first pads on a front face thereof;

providing a scan line layer with a plurality of second pads on a front face thereof;

providing an insulation layer between the return line layer and the scan line layer;

providing at least one ground pad on a rear face of the scan line layer and opposite to one of the second pads of the scan line layer; and providing an return line layer formed on the front face of the scan line layer and connected with one of the second pads of the scan line layer;

wherein the ground pads forms a capacitor with each corresponding pad of the scan line layer and the return line layer forms an inductor providing a filter circuit with the capacitor and wherein each of the capacitors is preferably installed between the input terminal of the scan line and the first touch pad.

7. The method of claim 6, wherein the diameters of the touch pad and the ground pad are between 3 mm and 4 mm.

8. The method of claim 6, wherein the shape of the return line layer is a reversed U shape.

9. The method of claim 8, wherein the interval between the reversed U-shaped inductors is about 0.3 mm.

10. A method for improving the EMC of a keyboard soft board, which comprises the steps of arbitrarily selecting more than one scan lines from a plurality of scan lines of the keyboard soft board and designing a low-pass filter for each of them;

the steps of designing the low-pass filter comprising providing a return line layer with a plurality of first pads on a front face thereof;

providing a scan line layer with a plurality of second pads on a front face thereof;

providing an insulation layer between the return line layer and the scan line layer;

providing at least one ground pad on a rear face of the scan line layer and opposite to one of the second pads of the scan line layer; and providing an return line layer formed on the front face of the scan line layer and connected with one of the second pads of the scan line layer;

wherein the ground pad forms a capacitor with corresponding pad of the scan line layer and the return line layer forms an inductor providing a filter circuit with the capacitor.

11. The method of claim 10, wherein the diameters of the touch pad and the ground pad are between 3 mm and 4 mm.

12. The method of claim 10, wherein each of the capacitors is preferably installed between the input terminal of the scan line and the first touch pad.

13. The method of claim 10, wherein the shape of the trace is a reversed U shape.

14. The method of claim 13, wherein the interval between the reversed U-shaped inductors is about 0.3 mm.

* * * * *